(12) United States Patent
Motallebi et al.

(10) Patent No.: US 8,492,569 B2
(45) Date of Patent: Jul. 23, 2013

(54) ANTHRAQUINONE DYE-CONTAINING MATERIAL, COMPOSITION INCLUDING THE SAME, CAMERA INCLUDING THE SAME, AND ASSOCIATED METHODS

(75) Inventors: Shahrokh Motallebi, Los Gatos, CA (US); Sina Maghsoodi, San Jose, CA (US)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 788 days.

(21) Appl. No.: 12/654,410

(22) Filed: Dec. 18, 2009

(65) Prior Publication Data

US 2011/0149128 A1 Jun. 23, 2011

(51) Int. Cl.
- C09B 1/16 (2006.01)
- C07C 50/24 (2006.01)
- C08F 26/06 (2006.01)
- C08F 126/06 (2006.01)
- G03B 7/099 (2006.01)

(52) U.S. Cl.
USPC ............ 552/247; 552/208; 396/275; 526/260

(58) Field of Classification Search
None
See application file for complete search history.

(56) References Cited

U.S. PATENT DOCUMENTS

| 4,222,947 | A | 9/1980 | Hederich et al. |
|---|---|---|---|
| 4,255,154 | A | 3/1981 | Zurbuchen et al. |
| 4,436,906 | A | 3/1984 | Niwa et al. |
| 4,943,617 | A | 7/1990 | Etzbach et al. |
| 5,002,925 | A | 3/1991 | Takuma et al. |
| 5,055,602 | A | 10/1991 | Melpolder |
| 5,162,545 | A | 11/1992 | Etzbach et al. |
| 5,362,812 | A | 11/1994 | Holmes et al. |
| 5,532,111 | A | 7/1996 | Holmes et al. |
| 6,803,168 | B1 | 10/2004 | Padmanaban et al. |
| 7,172,634 | B2 | 2/2007 | Pearson et al. |
| 7,179,308 | B2 | 2/2007 | Perason et al. |
| 2004/0024100 | A1* | 2/2004 | Parent et al. ............... 524/366 |
| 2004/0059044 | A1 | 3/2004 | Olson et al. |
| 2008/0044766 | A1 | 2/2008 | Kwon et al. |
| 2008/0182956 | A1* | 7/2008 | Stanbro et al. ............ 526/260 |

FOREIGN PATENT DOCUMENTS

| JP | 02-132462 A | 5/1990 |
|---|---|---|
| JP | 2008-106195 A | 5/2008 |
| JP | 2008-297472 A | 12/2008 |
| KR | 10-2000-0029602 A | 5/2000 |
| KR | 10-2008-0004180 A | 1/2008 |

OTHER PUBLICATIONS

Scifinder datasheet Stanbro (Jul. 2008).*
Scifinder data sheet for Etzbach (Jul. 1990).*

* cited by examiner

Primary Examiner — Amanda C. Walke
(74) Attorney, Agent, or Firm — Lee & Morse, P.C.

(57) ABSTRACT

A (meth)acrylate ester includes a (meth)acrylate moiety having an ester oxygen, an anthraquinone moiety having a transmittance spectrum producing blue light, and a linking group covalently bound to the ester oxygen and to a ring of the anthraquinone moiety, the linking group including, as a first component: phenyl, naphthyl, a linear alkyl group having from 1 to about 6 carbons, a branched alkyl group having from 3 to about 6 carbons, a cycloalkyl group having from about 3 to about 20 carbons, or a substituted aromatic group.

16 Claims, 3 Drawing Sheets

II

III

ANTHRAQUINONE DYE-CONTAINING MATERIAL, COMPOSITION INCLUDING THE SAME, CAMERA INCLUDING THE SAME, AND ASSOCIATED METHODS

BACKGROUND OF THE INVENTION

1. Field of the Invention

Embodiments relate to an anthraquinone dye-containing material, a composition including the same, a camera including the same, and associated methods.

2. Description of the Related Art

Image sensors based on charge coupled device (CCD) technology or complementary metal oxide semiconductor (CMOS) technology are widely used in digital imaging devices, e.g., digital point-and-shoot cameras, digital single lens reflex cameras, digital cameras in cell phones, computer web cameras (webcams), etc.

The pixel size of red, green, and blue in a color filter array of an image sensor should be reduced in order to obtain higher-resolution images for a sensor of a given size. In the manufacture of color filters, pigmented color resists have been used. However, pigmented color resists may be heterogeneous, i.e., the pigment may be heterogeneous with respect to, and insoluble in, the resist matrix. Accordingly, pigmented color resists may not provide sufficient lithographic resolution, making the manufacture of high-resolution image sensors difficult. Further, pigmented color resists may leave behind residues after patterning of the color filter.

Dye-based color resists may be used instead of pigmented color resists. Such dye-based color resists may provided enhanced homogeneity and may leave less residue than pigmented color resists. However, dye-based color resists may not afford desired levels of thermal stability, light stability, and chemical stability.

SUMMARY OF THE INVENTION

Embodiments are therefore directed to an anthraquinone dye-containing material, a composition including the same, a camera including the same, and associated methods, which substantially overcome one or more of the problems due to the limitations and disadvantages of the related art.

Features and advantages of the present invention may be realized by providing a (meth)acrylate ester, including a (meth)acrylate moiety having an ester oxygen, an anthraquinone moiety having a transmittance spectrum producing blue light, and a linking group covalently bound to the ester oxygen and to a ring of the anthraquinone moiety, the linking group including, as a first component: phenyl, naphthyl, a linear alkyl group having from 1 to about 6 carbons, a branched alkyl group having from 3 to about 6 carbons, a cycloalkyl group having from about 3 to about 20 carbons, or a substituted aromatic group.

The linking group may further include an ether group, the ether group including oxygen bound to: phenyl, naphthyl, a linear alkyl group having from 1 to about 6 carbons, a branched alkyl group having from 3 to about 6 carbons, a cycloalkyl group having from about 3 to about 20 carbons, or a substituted aromatic group, and the ether group may be repeated up to one time in the linking group, the ether group being disposed between the first component and the ester oxygen.

The linking group may include a nitrogen that is covalently bound to an outer ring of the anthraquinone moiety.

The linking group may include a phenyl that is covalently bound to an outer ring of the anthraquinone moiety.

The anthraquinone moiety may be an anthraquinone-2,3-dicarboximide moiety, and the linking group may be bound to the imide nitrogen.

Features and advantages of the present invention may also be realized by providing a method of synthesizing a (meth)acrylate ester, the method including providing an anthraquinone compound having an anthraquinone moiety and having a reactive group attached to a ring of the anthraquinone moiety, the anthraquinone moiety having a transmittance spectrum producing blue light, reacting a linking group compound with the reactive group such that the linking group compound becomes covalently bound to the ring of the anthraquinone moiety, the linking group compound including, as a first component: phenyl, naphthyl, a linear alkyl group having from 1 to about 6 carbons, a branched alkyl group having from 3 to about 6 carbons, a cycloalkyl group having from about 3 to about 20 carbons, or a substituted aromatic group, and reacting a (meth)acrylic acid-derived compound with the linking group compound such that the linking group compound becomes covalently bound to an ester oxygen of the (meth)acrylate ester.

The linking group compound may further include an ether group, the ether group including oxygen bound to: phenyl, naphthyl, a linear alkyl group having from 1 to about 6 carbons, a branched alkyl group having from 3 to about 6 carbons, a cycloalkyl group having from about 3 to about 20 carbons, or a substituted aromatic group, and the ether group is repeated up to one time in the linking group, the ether group being disposed between the first component and the ester oxygen.

The linking group compound may be an amino alcohol, and reacting the linking group compound with the reactive group may cause an amine nitrogen of the amino alcohol to covalently bind to the ring of the anthraquinone moiety.

The linking group compound may include a phenyl, and reacting the linking group compound with the reactive group may cause the phenyl to covalently bind to the ring of the anthraquinone moiety.

The anthraquinone moiety may be an anthraquinone-2,3-dicarboximide moiety, and reacting the linking group compound with the reactive group may cause the linking group compound to covalently bind to the imide nitrogen.

The (meth)acrylic acid-derived compound may be a (meth)acrylic acid anhydride.

Features and advantages of the present invention may also be realized by providing a method of manufacturing a camera, the method including providing a sensor array, and mounting a color filter proximate to a sensor array, the color filter including a blue filter region therein. The blue filter region may include a pattern of blue color photoresist, and the blue color photoresist may include a polymer having a backbone at least a portion of which corresponds to a (meth)acrylate, the (meth)acrylate including: a (meth)acrylate moiety having an ester oxygen, an anthraquinone moiety having a transmittance spectrum producing blue light, and a linking group covalently bound to the ester oxygen and to a ring of the anthraquinone moiety, the linking group including, as a first component: phenyl, naphthyl, a linear alkyl group having from 1 to about 6 carbons, a branched alkyl group having from 3 to about 6 carbons, a cycloalkyl group having from about 3 to about 20 carbons, or a substituted aromatic group.

The blue color photoresist may include the polymer, a crosslinker, the crosslinker being polymerizable with the polymer, and an initiator that is reactive to UV light.

The crosslinker may include an acrylate oligomer.

The acrylate oligomer may include a polyol (meth)acrylate ester.

The blue filter region may include a blue color pixel having a width of about 2 μm or less.

The blue filter region may include a blue color pixel having a width of about 1.4 μm or less.

Features and advantages of the present invention may also be realized by providing a camera, including a sensor array, and a color filter proximate to the sensor array, the color filter including a blue filter region. The blue filter region may include a pattern of blue color photoresist, and the blue color photoresist may include a polymer having a backbone, at least a portion of the backbone corresponding to a (meth)acrylate that includes: a (meth)acrylate moiety having an ester oxygen, an anthraquinone moiety having a transmittance spectrum producing blue light, and a linking group covalently bound to the ester oxygen and to a ring of the anthraquinone moiety, the linking group including, as a first component: phenyl, naphthyl, a linear alkyl group having from 1 to about 6 carbons, a branched alkyl group having from 3 to about 6 carbons, a cycloalkyl group having from about 3 to about 20 carbons, or a substituted aromatic group.

The blue filter region may include a blue color pixel having a width of about 2 μm or less.

The blue filter region may include a blue color pixel having a width of about 1.4 μm or less.

BRIEF DESCRIPTION OF THE DRAWINGS

The features and advantages will become more apparent to those of skill in the art by describing in detail example embodiments with reference to the attached drawings, in which.

DETAILED DESCRIPTION OF THE INVENTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions may be exaggerated for clarity of illustration. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a solvent" may represent a single solvent or multiple solvents in combination.

As used herein, molecular weights of polymeric materials are weight average molecular weights (Mw), unless otherwise indicated.

As used herein, the term "(meth)acrylate" refers to both acrylate and methacrylate. Thus, for example, the term ethyl (meth)acrylate refers to both ethyl acrylate and ethyl methacrylate. Further, the term "acrylate" is generic to both acrylate and methacrylate, unless specified otherwise. Thus, ethyl acrylate and ethyl methacrylate are both acrylates.

Embodiments relate to an anthraquinone dye-containing material, a composition including the same, a camera including the same, and associated methods. The anthraquinone dye-containing material may be a polymer represented by Formula I below:

(I)

In Formula I, the unit $R_1$ may be derived from a monomeric unit that imparts blue color to the polymer, i.e., producing blue light from white light by selective absorption of some wavelengths of light.

The monomeric unit $R_1$ may include an acrylic or methacrylic moiety (the acrylic or methacrylic moiety being generically referred to as a "(meth)acrylic moiety") and a dye moiety covalently bound thereto. The dye moiety may be an anthraquinone moiety. For example, the unit $R_1$ may be derived from a (meth)acrylate ester that includes an anthraquinone moiety, the anthraquinone moiety having a transmittance spectrum producing blue light, as described in detail below.

In Formula I, the units $R_2$ and $R_3$ may be derived from olefinic monomers and may be different from one another. The unit $R_4$ may be an olefinic monomer having a carboxyl group.

The anthraquinone dye-containing polymer represented by Formula I may be a random copolymer. In Formula 1, $fR_1 + fR_2 + fR_3 + fR_4 = 1$. The fraction $fR_1$ of the unit $R_1$ may be about 10 mole percent ("mol. %") to about 95 mol. % of the polymer (i.e., about 0.10 to about 0.95), preferably about 40 mol. % to about 80 mol. %. The fraction $fR_2$ of the unit $R_2$ may be about 0 mol. % to about 50 mol. % of the polymer (it will be understood that a fraction of 0 mol. % indicates that the fraction may be omitted). In an implementation, the fraction $fR_2$ of the unit $R_2$ is from greater than 0 mol. % (i.e., the unit $R_2$ is present in the polymer) to about 50 mol. % of the polymer. The fraction $fR_3$ of the unit $R_3$ may be about 0 mol. % to about 50 mol. % of the polymer. In an implementation, the fraction $fR_3$ of the unit $R_3$ is from greater than 0 mol. % (i.e., the unit $R_3$ is present in the polymer) to about 50 mol. % of the polymer. In an implementation, at least one of $R_2$ and

$R_3$ may be included in the polymer. The fraction $fR_4$ of the unit $R_4$ may be about 5 mol. % to about 30 mol. % of the polymer, preferably about 10 mol. % to about 20 mol. %. As discussed above, $fR_1+fR_2+fR_3+fR_4=1$. Accordingly, the sum of the mol. % of the fractions $fR_1$, $fR_2$, $fR_3$, and $fR_4$ totals 100 mol. %.

The anthraquinone dye-containing polymer represented by Formula I may be formed by polymerizing an anthraquinone dye-containing monomer according to an embodiment (for the group $R_1$) with monomers corresponding to units $R_2$-$R_4$ described above. The anthraquinone dye-containing polymer represented by Formula I may have a molecular weight Mw of about 2,000 to about 50,000, preferably about 4,000 to about 20,000.

The unit $R_1$ may include a linking group between the anthraquinone dye moiety and the (meth)acrylic functional group. The linking group may enable polymerization by reducing steric hindrance by positioning the dye moiety apart from the (meth)acrylic functional group.

The linking group may be, e.g., an amino alcohol, i.e., a compound having an amine functional group and a hydroxyl group. The amino alcohol may be an alkyl or aryl amino alcohol. The linking group may include phenyl, naphthyl, a linear alkyl group having from 1 to about 6 carbons (i.e., 1, 2, 3, 4, 5, or 6 carbons (or more)), a branched alkyl group having from 3 to about 6 carbons (i.e., 3, 4, 5, or 6 carbons (or more)), a cycloalkyl group having from about 3 to about 20 carbons (i.e., 3, 4, 5, 6, 7, 8, 9, 10, 11, 12, 13, 14, 15, 16, 17, 18, 19, or 20 carbons (or more)), or a substituted aromatic group. The linking group may further include an ether (—O—R—), where the R is one of the above-described groups. In an implementation, the ether group may be repeated in the linking group, e.g., repeated one time, so that two ether groups are attached end-to-end as (—O—R—)$_2$.

Figure 1:
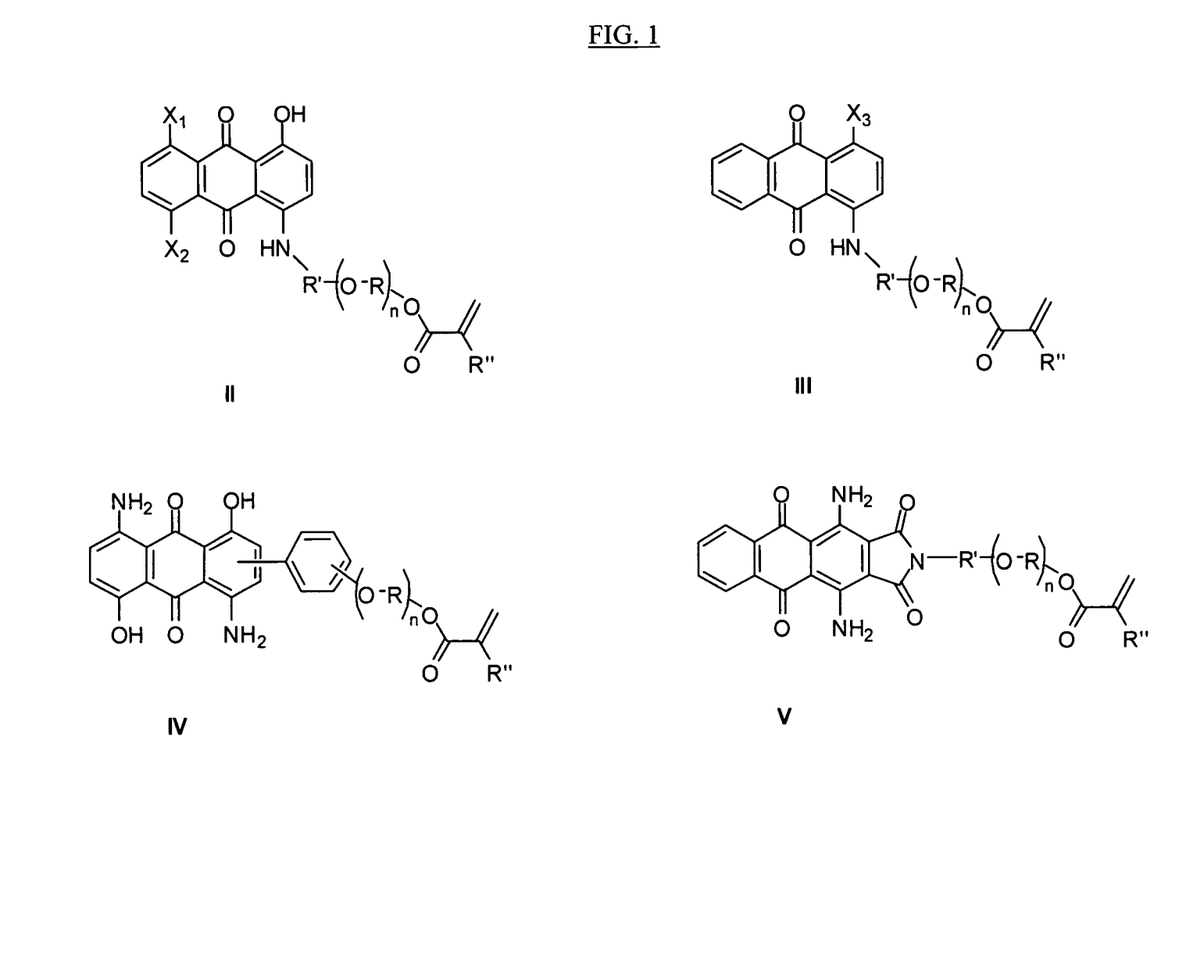
FIG. 1 illustrates Formulae II-V representing example anthraquinone dye-containing (meth)acrylic monomers according to embodiments.

Particular examples of monomers usable to form the unit $R_1$ are represented by Formulae II through V shown in FIG. 1 and reproduced below:

In Formula II, one of $X_1$ and $X_2$ may be $NO_2$, $NH_2$, or OH; the other of $X_1$ and $X_2$ may be OH.

In Formula III, $X_3$ may be $NH_2$, OH, NH-alkyl, NH-aryl, O-alkyl, or O-aryl.

In Formulae II, III, and V, R' may be, e.g., phenyl, naphthyl, a linear alkyl group having from 1 to about 6 carbons, a branched alkyl group having from 3 to about 6 carbons, a cycloalkyl group having from about 3 to about 20 carbons, or a substituted aromatic group. In Formula IV, the linking group may include a phenyl moiety attached directly to an outer ring of the anthraquinone moiety, e.g., at the 2-position or 3-position between the OH and $NH_2$ groups.

In Formulae II, III, VI, and V, the ether moiety (—O—R—) of the linking group may be present as one instance (n=1) or two instances (n=2), or may be omitted (n=0). That is, n may be an integer from 0 to 2. In Formulae II, III, VI, and V, R in the ether moiety may be, e.g., phenyl, naphthyl, a linear alkyl group having from 1 to about 6 carbons, a branched alkyl group having from 3 to about 6 carbons, a cycloalkyl group having from about 3 to about 20 carbons, or a substituted aromatic group.

In Formulae II through V, R" may be, e.g., hydrogen (corresponding to acrylate) or methyl (corresponding to methacrylate).

In Formula V, the anthraquinone moiety is an anthraquinone-2,3-dicarboxylic acid imide, i.e., anthraquinone-2,3-dicarboximide. For this four-membered ring system, the ring formed by the imide is considered to be a ring of the anthraquinone moiety, i.e., the anthraquinone moiety contains four rings. In Formula V, the linking group may be covalently bound to the imide nitrogen.

Referring again to Formula I, the units $R_2$ and $R_3$ may provide solubility to the polymeric structure, e.g., solubility with other organic components in a photoresist composition used to form a blue filter. The units $R_2$ and $R_3$ may each be derived from olefinic polymerizable monomers and may be different from one another.

In an implementation, the units $R_2$ and $R_3$ may each be derived from esters of (meth)acrylic acids, i.e., esters of acrylic acids and/or esters of methacrylic acids. For example, $R_2$ and $R_3$ may be allyl (meth)acrylate, methyl (meth)acrylate, ethyl (meth)acrylate, n-propyl (meth)acrylate, isopropyl (meth)acrylate, butyl (meth)acrylate, tetrahydrofurfuryl (meth)acrylate, cyclohexyl (meth)acrylate, isobornyl (meth)

acrylate, n-hexyl (meth)acrylate, n-octyl (meth)acrylate, isooctyl (meth)acrylate, 2-ethylhexyl (meth)acrylate, lauryl (meth)acrylate, glycidyl (meth)acrylate, stearyl (meth)acrylate, phenyl (meth)acrylate, benzyl (meth)acrylate, 2-hydroxyethyl (meth)acrylate, 2-hydroxybutyl (meth)acrylate, 2-aminoethyl (meth)acrylate, or 2-dimethylaminoethyl (meth)acrylate.

In an implementation, the units $R_2$ and $R_3$ may each be derived from styrenes. For example, $R_2$ and $R_3$ may be derived from styrene, α-methylstyrene, vinyltoluene, or vinylbenzyl methyl ether.

In an implementation, the units $R_2$ and $R_3$ may each be derived from carboxylic acid vinyl esters. For example, $R_2$ and $R_3$ may be derived from vinyl acetate and vinylbenzoate, vinyl cyanide compounds such as acrylonitrile and methacrylonitrile, or unsaturated amides such as acrylamide and methacrylamide.

In Formula I, the unit $R_4$ may provide solubility in an aqueous alkaline solution, e.g., a photo resist developer solution. The unit $R_4$ may be derived from an olefinic polymerizable compound having a pendant carboxylic acid group. For example, the unit $R_4$ may be derived from (meth)acrylic acid (i.e., acrylic acid or methacrylic acid), maleic acid, itaconic acid, or fumaric acid.

The anthraquinone dye-containing polymer represented by Formula I may be used in a photoresist composition sensitive to radiation at, e.g., a 365 nm ("i-line") wavelength. In an implementation, the dye-containing methacrylic polymer may include an acid moiety in the polymer, e.g., the pendant carboxylic acid group discussed above in connection with unit $R_4$, such that the polymer can be used in a photoresist composition that exhibits negative resist characteristics, i.e., in a photoresist composition that polymerizes in regions exposed to radiation, and in which unexposed regions are removed upon developing. The developer may be an alkaline developer such as an aqueous tetramethyl ammonium hydroxide ("TMAH") solution. In another implementation, the photoresist composition may be a positive resist.

Figure 2:
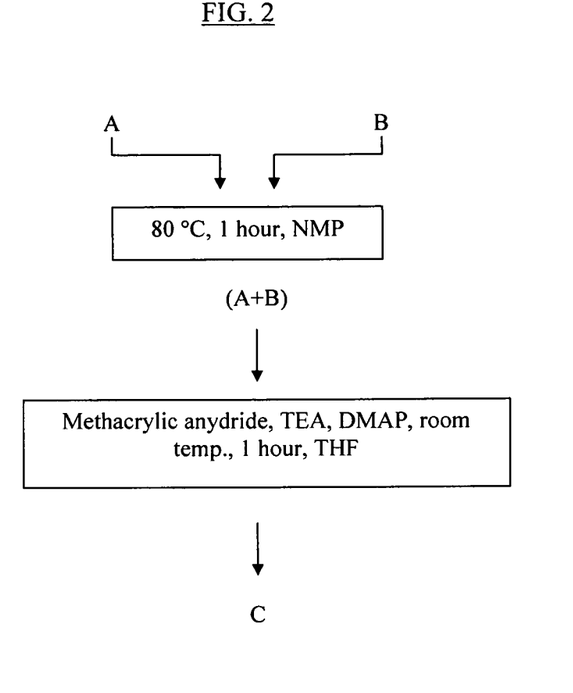
FIG. 2 illustrates an example synthetic method for an anthraquinone dye-containing (meth)acrylic monomer according to an embodiment.

In an embodiment, the anthraquinone dye-containing monomers according to embodiments, e.g., monomers according to Formulae II-V, may be formed by modifying an anthraquinone dye moiety with a linking group, and then bonding the modified dye moiety to a (meth)acrylic functional group. FIG. 2 illustrates an example of such a synthesis for an anthraquinone dye-containing monomer according to an embodiment.

Referring to FIG. 2, components A and B may be reacted together, e.g., by combining an anthraquinone dye moiety (A) with a linking group (B). The combination of A+B may be subsequently combined with a (meth)acrylic functional group, e.g., methacrylic anhydride, to form an anthraquinone dye-containing (meth)acrylic monomer C.

In an implementation, the reaction of components A and B may be performed at a temperature of about 80° C. for about 1 hour in a solvent solution of, e.g., N-methylpyrrolidone ("NMP"). The reaction product A+B of components A and B may then be combined with, e.g., methacrylic anhydride, as well as an amine base, e.g., triethylamine ("TEA"), and dimethylaminopyridine ("DMAP") in an aprotic organic solvent such as tetrahydrofuran ("THF"). The mixture may be allowed to react at room temperature for a period of, e.g., about 1 hour, yielding the anthraquinone dye-containing (meth)acrylic monomer C.

Thermal stability of the monomer (C) may be an important consideration in applications of the monomer to form a photoresist for a color filter. The thermal stability may be measured by thermal gravimetric analysis ("TGA"). It may be important to note that 5% weight loss-temperatures of the anthraquinone dye-containing monomers may vary considerably based on the type and number of the linking groups (i.e., the linking group derived from component B).

Synthesis of Dye-Containing (Meth)Acrylic Monomers Represented by Formulae II, III and V:

Example of synthesis of Dye II: (where n=0 and R'=Ph):
A)  1,8-Dihydroxy-4-(4-hydroxyphenylamino)-5-nitroanthracene-9,10-dione A mixture of 1,8-dihydroxy-4,5-dinitroanthracene-9,10-dione (25.0 g, 75.8 mmoles, 1.0 equiv.), 4-aminophenol (20 g, 183.5 mmoles, 2.42 equiv) and N-methylpyrrolidone (NMP) (100 g) is heated to 135° C. for 1.0 hour. During the heating, a blue color solution is obtained which is then cooled to room temperature. The thus obtained solution is precipitated in water and the resulting suspension is filtered and the solid is rinsed with water and dried under vacuum at 60° C.

B)  4-(4,5-Dihydroxy-8-nitro-9,10-dioxo-9,10-dihydroanthracen-1-ylamino)phenyl methacrylate To a solution of 1,8-dihydroxy-4-(4-hydroxyphenylamino)-5-nitroanthracene-9,10-dione (10 g, 27.6 mmoles, 1.0 equiv.), methacrylic anhydride (5.44 g, 33.1 mmoles, 1.2 equiv.) in tetrahydrofuran (THF) (100 g), a solution of triethylamine (TEA) (3.63 g, 35.9 mmoles, 1.3 equiv.), N,N-dimethylaminopyridine (DMAP) (0.67 g, 5.5 mmoles, 0.2 equiv.) in THF (36.3 g) is drop wise added with stirring at room temperature. The mixture is stirred for 2 hours at room temperature and then neutralized with acetic acid. The thus obtained solution is precipitated in water and the resulting suspension is filtered and the solid is rinsed with water and dried under vacuum at 40° C.

Example of synthesis of Dye III where $X_3$=$NH_2$, R'=Ph and n=0:

A) 1-Amino-4-(4-hydroxyphenylamino)anthracene-9,10-dione

A mixture of 1-amino-4-hydroxyanthracene-9,10-dione (72.0 g, 302.4 mmoles, 1.0 equiv.), 4-aminophenol (42.7 g, 391.2 mmoles, 1.3 equiv), boric acid (37.4 g, 602.4 mmoles, 2.0 equiv.) and NMP (600 g) is heated to 130° C. for 3.0 hours. The thus obtained solution is cooled to room temperature and precipitated in water. The resulting suspension is filtered and the solid is rinsed with water and dried under vacuum at 60° C.

B) 4-(4-Amino-9,10-dioxo-9,10-dihydroanthracen-1-ylamino)phenyl methacrylate:

To a solution of 1-amino-4-(4-hydroxyphenylamino)anthracene-9,10-dione (82 g, 248.5 mmoles, 1.0 equiv.), methacrylic anhydride (48.9 g, 298.2 mmoles, 1.2 equiv.) in THF (820 g), a solution of TEA (32.6 g, 35.9 mmoles, 1.3 equiv.), DMAP (6.07 g, 5.5 mmoles, 0.2 equiv.) in THF (326 g) is drop wise added with stirring at room temperature. The mixture is stirred for 2 hours at room temperature and then neutralized with acetic acid. The thus obtained solution is precipitated in water and the resulting suspension is filtered and the solid is rinsed with water and dried under vacuum at 40° C.

Example of synthesis of Dye V where R'=Et and n=0:

A) 4,11-Diamino-1h-naphtho[2,3-f] isoindole-1,3,5,10(2h)-tetraone:

1,4-diamino-9,10-dioxo-9,10-dihydroanthracene-2,3-dicarbonitrile (100 g) is added in portions to sulfuric acid (95-98%, 630 g) at 80° C. over a period of 45 minutes. During the addition, the internal temperature is maintained below 90° C. Once the addition completed, the resulting mixture is heated at 140° C. for 1.0 hour and then cooled to 40° C. Water (250 g) is then added over a period of 30 min and the resulting suspension is stirred for 1.0 hour at room temperature. The suspension is filtered, and the solid washed with water and dried under vacuum at 60° C.

B) 4,11-Diamino-2-(2-hydroxyethyl)-1h-naphtho[2,3-f] isoindole-1,3,5,10(2h)-tetraone:

A solution of 4,11-diamino-1H-naphtho[2,3-f]isoindole-1,3,5,10(2H)-tetraone (20 g, 73.3 mmoles, 1.0 equiv.), 2-amino-1-ethanol (8.87 g, 146.7 mmoles, 2.0 equiv.) in NMP (30 g) is heated to 130° C. for 2 hours. The resulting solution is cooled to room temperature and precipitated in water. The solid is filtered and rinsed with water and dried under vacuum at 60° C.

C) 2-(4,11-Diamino-1,3,5,10-tetraoxo-1h-naphtho[2,3-f] isoindol-2(3h,5h,10h)-yl)ethyl methacrylate:

To a solution of 4,11-diamino-1H-naphtho[2,3-f]isoindole-1,3,5,10(2H)-tetraone (20 g, 57 mmoles, 1.0 equiv.), methacrylic anhydride (10.5 g, 68.2 mmoles, 1.2 equiv.) in THF (200 g), a solution of TEA (7.48 g, 35.9 mmoles, 1.3 equiv.), DMAP (1.4 g, 11.4 mmoles, 0.2 equiv.) in THF (75 g) is drop wise added with stirring at room temperature. The mixture is stirred for 2 hours at room temperature and then neutralized with acetic acid. The thus obtained solution is precipitated in water and the resulting suspension is filtered and the solid is rinsed with water and dried under vacuum at 40° C.

Polymerization

A terpolymer according to Formula I may be formed by polymerizing three kinds of monomers, corresponding to units $R_1$, $R_2$, and $R_4$, respectively. For example, the terpolymer may be formed by polymerizing (1) an anthraquinone dye-containing monomer represented by Formula II-V (i.e., C in FIG. 2), (2) benzyl methacrylate ("BzMA"), and (3) methacrylic acid ("MAA") for units $R_1$, $R_2$, and $R_4$, respectively. Polymerization may be performed in, e.g., THF.

The final molecular weight Mw of the polymer may be dependent on the amount of initiator. In particular, as the amount of initiator is increased, the Mw may decrease, e.g., by increasing the number of reaction starting points for the polymerization in a limited environment. Thus, it may be possible to control the Mw of the polymer by controlling the amount of initiator. In an implementation, the amount of initiator may be about 7 wt % with respect to the total weight of monomers.

In an example polymerization, a THF solution containing each of the three kinds of monomers (one of which is an anthraquinone dye-containing monomer represented by Formula II-V) and a radical initiator, e.g., AIBN, may be flushed with nitrogen for about 30 min. and then heated to reflux under a nitrogen atmosphere. The solution may be stirred at the reflux temperature for a period sufficient for the monomers to react, e.g., about 10 hours or more. The solution may then be cooled to room temperature and precipitated in hexanes and filters. The filtered solids may be rinsed in hexanes and then dried under vacuum to produce the desired terpolymer that includes, as a component thereof, the unit $R_1$ corresponding to the respective monomer represented by Formula II-V.

In performing the polymerization, it will be appreciated that the particular solvent used for the polymerization reaction may depend on the nature of the anthraquinone dye-containing monomer. In this regard, the solubility of the anthraquinone dye-containing monomer and the resulting polymerization product may be important in determining the choice of solvent and controlling the yield of the polymerization reaction. The anthraquinone dye-containing monomer may be largely insoluble in a solvent such as propylene glycol monomethyl ether acetate ("PGMEA"). Further, THF, NMP, and dimethyl formamide ("DMF") may better dissolve the anthraquinone dye-containing monomer than solvents such as toluene, acetonitrile, ethyl acetate, dichloromethane, n-hexane, and methyl alcohol.

The polymerization reaction mixture may be stirred to polymerize, e.g., for about 6 hr, and then cooled to room temperature. The resultant cooled reaction mixture may be added into an excess of n-hexane to form a precipitate. The precipitate may be filtered and dried to obtain the corresponding anthraquinone dye-containing polymer represented by Formula I. The molecular weight of the anthraquinone dye-containing polymer may be characterized by, e.g., gel permeation chromatography.

Formulation of an Example Photoresist Composition

An anthraquinone dye-containing polymer represented by Formula I, a base polymer, a crosslinker polymerizable with the polymer (e.g., a polyol (meth)acrylate ester crosslinker such as dipentaerythritol hexaacrylate ("DPHA")), and a photoinitiator (e.g., a triazine-type photoinitiator) may be added in a co-solvent of, e.g., propylene glycol monomethyl ether acetate ("PGMEA"), ethyl 3-ethoxy propionate, and cyclohexanone. The resulting solution may be stirred for, e.g., about 1 hr., to complete dissolution. The resultant composition may be used as a photoresist.

Photopatterning Test for Photoresist Formulations

A blue anthraquinone dye-containing polymer-based photoresist composition, formulated as described directly above, may be spin-coated, e.g., to a 6000 Angstrom thickness, on a silicon wafer. The coated wafer may then be baked, e.g., at 100° C. for 180 s. (seconds), after which it may be exposed at an i-line wavelength (365 nm) for, e.g., 100-1000 ms. The exposed wafer may then be developed, e.g., using 0.2% aqueous TMAH, and then baked again, e.g., at 200° C. for 300 s. The quality of resulting patterns may be observed using, e.g., CD SEM.

Figure 3:
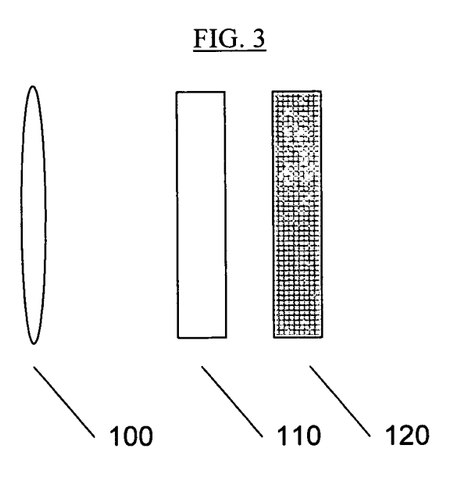
FIG. 3 illustrates a schematic diagram of a camera according to an embodiment.

FIG. 3 illustrates a schematic diagram of a camera according to an embodiment. The camera may include a sensor array 120 and a color filter 110 proximate to the sensor array 120. The camera may further include an optically transparent cover or lens 100. Light may enter the cover or lens 100 and pass through the color filter 110 before impinging on the sensor array 120.

The color filter 110 may be, e.g., a Bayer filter, etc., and may include a blue filter region that includes a photoresist producing blue light according to an embodiment (the photoresist producing blue light through use of a dye that selectively absorbs light is referred to herein as a "blue color photoresist"). The blue color photoresist may include a polymer having a backbone, at least a portion of which corresponds to a (meth)acrylate that includes an anthraquinone moiety having a transmittance spectrum producing blue light, and a linking group covalently bound to the anthraquinone moiety and an ester oxygen of the (meth)acrylate. The linking group may include phenyl, naphthyl, a linear alkyl group having from 1 to about 6 carbons, a branched alkyl group having from 3 to about 6 carbons, a cycloalkyl group having from about 3 to about 20 carbons, or a substituted aromatic group.

As described above, embodiments may provide materials suitable for a blue color photoresist. The photoresist may exhibit thermal stability, light stability, and chemical stability. The blue color photoresist may be used to fabricate, e.g., a color filter for a camera, the color filter being disposed adjacent to a sensor array such as a CMOS sensor. The blue color photoresist may be suitable for use with pixels having a dimension smaller than that practicable with conventional pigment-based materials. For example, the blue color photoresist according to embodiments may be used to fabricate pixels having a width of about 2 μm or less, e.g., 1.4 μm.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A (meth)acrylate ester, comprising:
   a (meth)acrylate moiety having an ester oxygen;
   an anthraquinone moiety having a transmittance spectrum producing blue light; and
   a linking group covalently bound to the ester oxygen and to a ring of the anthraquinone moiety, the linking group including, as a first component:
   a ring-containing moiety selected from the group of phenyl, naphthyl, a cycloalkyl group having from about 3 to about 20 carbons, or a substituted aromatic group, wherein a ring of the ring-containing moiety is directly bonded to the ester oxygen.

2. The (meth)acrylate ester as claimed in claim 1, wherein the linking group includes a nitrogen that is covalently bound to an outer ring of the anthraquinone moiety.

3. The (meth)acrylate ester as claimed in claim 1, wherein the linking group includes a phenyl that is covalently bound to an outer ring of the anthraquinone moiety.

4. A method of synthesizing a (meth)acrylate ester, the method comprising:
providing an anthraquinone compound having an anthraquinone moiety and having a reactive group attached to a ring of the anthraquinone moiety, the anthraquinone moiety having a transmittance spectrum producing blue light;
reacting a linking group compound with the reactive group such that the linking group compound becomes covalently bound to the ring of the anthraquinone moiety, the linking group compound including, as a first component:
a ring-containing moiety selected from the group of phenyl, naphthyl, a cycloalkyl group having from about 3 to about 20 carbons, or a substituted aromatic group; and
reacting a (meth)acrylic acid-derived compound with the linking group compound such that a ring of the ring-containing moiety becomes directly covalently bound to an ester oxygen of the (meth)acrylate ester.

5. The method as claimed in claim 4, wherein:
the linking group compound is an amino alcohol, and
reacting the linking group compound with the reactive group causes an amine nitrogen of the amino alcohol to covalently bind to the ring of the anthraquinone moiety.

6. The method as claimed in claim 4, wherein:
the linking group compound includes a phenyl, and
reacting the linking group compound with the reactive group causes the phenyl to covalently bind to the ring of the anthraquinone moiety.

7. The method as claimed in claim 4, wherein the (meth)acrylic acid-derived compound is a (meth)acrylic acid anhydride.

8. A method of manufacturing a camera, the method comprising:
providing a sensor array; and
mounting a color filter proximate to a sensor array, the color filter including a blue filter region therein, wherein:
the blue filter region includes a pattern of blue color photoresist, and
the blue color photoresist includes a polymer having a backbone at least a portion of which corresponds to a (meth)acrylate, the (meth)acrylate including:
a (meth)acrylate moiety having an ester oxygen;
an anthraquinone moiety having a transmittance spectrum producing blue light; and
a linking group covalently bound to a ring of the anthraquinone moiety, the linking group including, as a first component:
a ring-containing moiety selected from the group of phenyl, naphthyl, a cycloalkyl group having from about 3 to about 20 carbons, or a substituted aromatic group, wherein a ring of the ring-containing moiety is directly bonded to the ester oxygen.

9. The method as claimed in claim 8, wherein the blue color photoresist includes:
the polymer,
a crosslinker, the crosslinker being polymerizable with the polymer, and
an initiator that is reactive to UV light.

10. The method as claimed in claim 9, wherein the crosslinker includes an acrylate oligomer.

11. The method as claimed in claim 10, wherein the acrylate oligomer includes a polyol (meth)acrylate ester.

12. The method as claimed in claim 8, wherein the blue filter region includes a blue color pixel having a width of about 2 µm or less.

13. The method as claimed in claim 12, wherein the blue filter region includes a blue color pixel having a width of about 1.4 µm or less.

14. A camera, comprising:
a sensor array; and
a color filter proximate to the sensor array, the color filter including a blue filter region, wherein:
the blue filter region includes a pattern of blue color photoresist, and
the blue color photoresist includes a polymer having a backbone, at least a portion of the backbone corresponding to a (meth)acrylate that includes:
a (meth)acrylate moiety having an ester oxygen;
an anthraquinone moiety having a transmittance spectrum producing blue light; and
a linking group covalently bound to a ring of the anthraquinone moiety, the linking group including, as a first component:
a ring-containing moiety selected from the group of phenyl, naphthyl, a cycloalkyl group having from about 3 to about 20 carbons, or a substituted aromatic group, wherein a ring of the ring-containing moiety is directly bonded to the ester oxygen.

15. The camera as claimed in claim 14, wherein the blue filter region includes a blue color pixel having a width of about 2 µm or less.

16. The camera as claimed in claim 15, wherein the blue filter region includes a blue color pixel having a width of about 1.4 µm or less.

* * * * *